Figure 1:
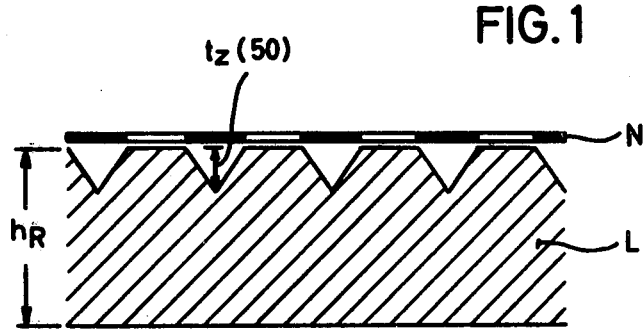

United States Patent [19]

Hoffmann et al.

[11] 4,189,322

[45] Feb. 19, 1980

[54] PHOTOPOLYMERIZABLE COMPOSITIONS FOR THE PRODUCTION OF PRINTING PLATES AND RELIEF PLATES CONTAINING DIANTHRONYL OR BISANTHRONE COMPOUND

[75] Inventors: Gerhard Hoffmann, Speyer; Dieter Kleuser; Bernd Bronstert, both of Frankenthal, all of Fed. Rep. of Germany

[73] Assignee: BASF Aktiengesellschaft, Fed. Rep. of Germany

[21] Appl. No.: 902,764

[22] Filed: May 3, 1978

[30] Foreign Application Priority Data

May 7, 1977 [DE] Fed. Rep. of Germany ....... 2720560

[51] Int. Cl.² .............................................. G03C 1/68
[52] U.S. Cl. .................................. 430/284; 430/281; 430/916; 430/923; 525/1
[58] Field of Search ................. 96/35.1, 115 R, 115 P

[56] References Cited

U.S. PATENT DOCUMENTS

| 3,219,566 | 11/1965 | Potts et al. | 96/115 R |
| 4,023,973 | 5/1977 | Imaizumi et al. | 96/115 P |

FOREIGN PATENT DOCUMENTS 1591359  6/1970  France .

*Primary Examiner*—John D. Welsh
*Attorney, Agent, or Firm*—Keil & Witherspoon

[57] ABSTRACT

Photopolymerizable compositions for the production of printing plates and relief plates, consisting essentially of a photoinitiator-containing mixture of olefinically unsaturated photopolymerizable compounds with polymeric binders, contain up to 1% by weight of a compound having the structural element of anthrone, e.g. bianthrone and 9,9'-bianthryl, which results in an improved relief image in the production of relief plates.

5 Claims, 2 Drawing Figures

PHOTOPOLYMERIZABLE COMPOSITIONS FOR THE PRODUCTION OF PRINTING PLATES AND RELIEF PLATES CONTAINING DIANTHRONYL OR BISANTHRONE COMPOUND

The present invention relates to improved photopolymerizable compositions for the production of printing plates and relief plates which consist essentially of a mixture of at least one low molecular weight compound having at least one olefinically unsaturated photopolymerizable double bond and an organic polymeric binder that is compatible therewith, and which contain small amounts of specific organic compounds to obtain a better relief image and in particular to improve the depth of shadow wells in the production of relief plates.

Photopolymerizable compositions for the production of printing plates have frequently been described, it being possible to employ both fluid and solid compositions. For example, German Laid-Open Application DOS 20 40 390 discloses fluid resin compositions based on mixtures of 5 to 55% by weight of unsaturated monomers, such as acrylic or allyl compounds, and 95 to 45% by weight of an unsaturated polyester, which contain conventional amounts of a photoinitiator and a thermal polymerization inhibitor, and are used to produce relief printing plates by imagewise exposure of layers thereof and subsequent washout of the unexposed areas with a developer solution. When printing plates having relief heights of from about 0.5 to 1 mm, which are the ones usually employed in the graphic industry, are produced with these conventional compositions for instance, they usually do not exhibit a sharp relief image and often have side walls which are not steep enough.

It is known that improved relief printing plates can be obtained by using certain dodges during exposure of the photopolymer plates through the image-bearing negative; employing multilayer photopolymer plates; or arranging other layers beneath the photopolymer layer, which layers influence the sidewall structure of the relief. However, these methods are complicated and expensive.

It is an object of the invention to provide photopolymerizable compositions containing small amounts of chemical additives which give relief plates having an improved relief image in the conventional method of producing such plates.

We have found, surprisingly, that this object is achieved and that photopolymerizable compositions for the production of printing plates and relief plates, based on a photoinitiator-containing mixture of at least one low molecular weight compound having at least one olefinically unsaturated photopolymerizable double bond with at least one organic polymeric binder that is compatible with said compound give much improved relief images if they contain, uniformly dispersed therein, from about 0.0001 to 1%, preferably 0.0001 to 0.1%, by weight, based on the whole composition, of an anthrone compound, i.e. a compound which contains the structural element (I):

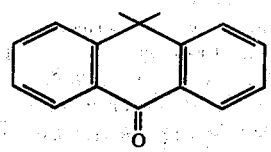

at least once and preferably twice.

Of these compounds, 9,9'-dianthronyl (also referred to as 9,9'-bianthrone; formula II) and 10,10'-bisanthrone (also referred to as 9,9'-bianthrylidene-10,10'-quinone; formula III):

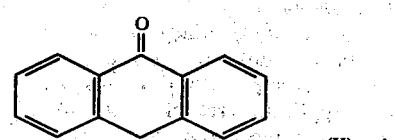

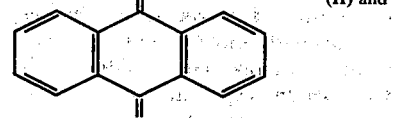

have proved to be particularly suitable and effective when used in extremely small amounts.

It is surprising that the addition of such a compound even in extremely small amounts distinctly improves the relief image without affecting the other properties of the photopolymerizable compositions to any great extent.

Figure 2:
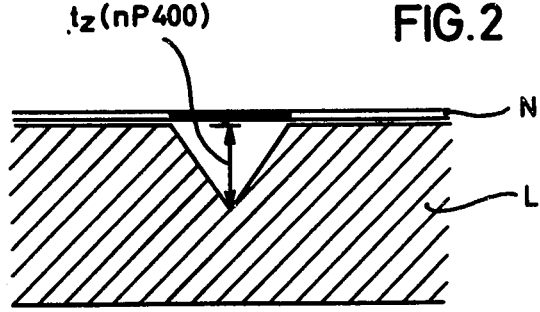

To better assess the quality of the image in different sections of the relief of one and the same plate, it is advantageous to measure the depth of shadow wells in halftone areas produced with screens of different ruling and tone value, and for negative dots, having a diameter of 400 μm, in a solid area. FIG. 1 shows how, after exposure of a layer L of a photopolymerizable composition with actinic light through a negative N and development by washing out the non-polymerized areas of the layer L with a developer solution, a relief having a relief height $h_R$ and a shadow well depth $t_z$ in a halftone area of 50% tone value, this depth being referred to hereinafter as "$t_z(50)$", is produced. The same is shown in FIG. 2 for an opaque dot (in negative N) having a diameter of 0.4 mm in a clear area which is large in relation thereto, here and hereinafter referred to as "negative dot", the shadow dot depth being referred to hereinafter as $t_z(nP400)$. As the Examples described below show, a considerable improvement in the shadow well depth and hence in the structure of the relief can be achieved with the compositions of the invention.

Suitable organic polymeric binders for the photopolymerizable compositions for the production of printing plates and relief plates are those conventionally used for this purpose, it being necessary for them to be compatible with the co-used monomers and—which is evident to the skilled artisan—to be soluble or dispersible in the developer solutions employed, to enable the unexposed and hence non-crosslinked areas of layer L of the photopolymerizable composition, after imagewise exposure thereof, to be washed out. Specific examples of suitable polymeric optically saturated or unsaturated binders are linear polyamides and particularly alcohol-soluble copolyamides such as are described in French Pat. No. 1,520,856, cellulose derivatives, particularly cellulose derivatives which can be washed out with aqueous alkaline solutions, vinyl alcohol polymers and polymers and copolymers of vinyl esters of aliphatic monocarboxylic acids of 1 to 4 carbon atoms, e.g. of vinyl acetate, having varying degrees of saponification, polyurethanes, polyether-urethanes and polyester-urethanes, particularly polyester resins, especially those disclosed in German Laid-Open Application (DOS) 20 40 390. Of the linear or branched polyesters produced by reaction of unsaturated and/or saturated dibasic and/or higher polybasic carboxylic acids with dihydric and/or higher polyhydric alcohols, those are preferred which have a relatively high acid number and especially an acid number of from 75 to 160 because they result in the compositions being readily dispersible or soluble in aqueous alkaline developer solutions. With regard to the composition and production of unsaturated polyester resins reference is made to the existing literature, e.g. H. V. Boenig, Unsaturated Polyesters, Structure and Properties, Amsterdam, 1964.

Polymeric binders which are also suitable for the production of flexographic printing plates are elastomeric diene homopolymers and copolymers, e.g. homopolymers and copolymers of butadiene and/or isoprene, of which copolymers of butadiene and/or isoprene homopolymer blocks and polymer blocks of styrene or α-methylstyrene are particularly suitable.

The content of polymeric binder in the composition is generally from about 45 to 90% by weight and especially from 45 to 80% by weight, based on the amount of polymer and photopolymerizable monomers.

Suitable low molecular weight compounds having at least one olefinically unsaturated photopolymerizable double bond are monomers which are used for photopolymer printing plates, provided they form compatible mixtures with the particular polymeric binder employed and have a boiling point of more than 100° C. at atmospheric pressure. Monomers having two or more olefinically unsaturated photopolymerizable double bonds are preferred; these may be used alone or in admixture with monomers having only one olefinically unsaturated photopolymerizable double bond, the content of the latter being generally from about 5 to 50% by weight and preferably from 5 to 30% by weight of the total amount of monomers. The type of monomers used depends substantially on the type of co-used polymeric binder. Particularly suitable in the case of mixtures with unsaturated polyester resins are allyl compounds containing two or more double bonds, such as dialkyl maleate, allyl acrylate, diallyl phthalate, trimellitic acid diallyl and triallyl esters, and ethylene glycol bisallyl carbonate, as well as diacrylates, polyacrylates, dimethacrylates and polymethacrylates such as may be obtained by esterification of diols or polyols with acrylic acid and methacrylic acid respectively, e.g. the diacrylates, triacrylates, dimethacrylates and trimethacrylates of ethylene glycol, diethylene glycol, triethylene glycol and polyethylene glycol having a molecular weight of up to about 500, 1,2-propanediol, 1,3-propanediol, neopentyl glycol (2,2-dimethylpropanediol), 1,4-butanediol, 1,1,1-trimethylolpropane, glycerol and pentaerythritol; also very suitable are the monoacrylates and monomethacrylates of such diols and polyols, e.g. ethylene glycol monoacrylate, diethylene glycol monoacrylate, triethylene glycol monoacrylate and tetraethylene glycol monoacrylate, monomers having two or more olefinically unsaturated bonds which contain urethane groups and/or amide groups, such as the low molecular weight compounds produced from aliphatic diols of the aforementioned type, organic diisocyanates and hydroxyalkyl acrylates and methacrylates. Further examples are acrylic acid, methacrylic acid and the derivatives thereof, such as acrylamide, methacrylamide, N-hydroxymethyl acrylamide or methacrylamide, and acrylates or methacrylates of monoalcohols of 1 to 6 carbon atoms. Mixtures of allyl monomers with diacrylates or polyacrylates are very suitable.

When compositions containing a polyamide as the polymeric binder are employed, of the said types of monomer not only are diacrylates and polyacrylates particularly suitable, but also those which contain amide and/or urethane groups in addition to the double bonds, such as derivatives of acrylamides, e.g. the reaction products of 2 moles of N-(hydroxymethyl)acrylamide or N-(hydroxymethyl)methacrylamide and 1 mole of an aliphatic diol, such as ethylene glycol, xylylene bisacrylamide and alkylene bisacrylamides of 1 to 8 carbon atoms in the alkylene radical. Water-soluble monomers, e.g. hydroxyethyl acrylate or methacrylate, and monoacrylates, diacrylates, monomethacrylates or dimethacrylates of polyethylene glycols having a molecular weight of about 200 to 500 are particularly suitable for the production of printing plates which can be developed with aqueous alkaline solutions and contain polyvinyl alcohol as polymeric binder.

The amount of monomer or monomer mixture is generally from about 10 to 55% by weight and particularly from 20 to 55% by weight, based on the amount of polymer and photopolymerizable monomers, and is determined by, inter alia, the compatibility of the monomer or monomer mixture and the desired hardness of the resulting relief plate.

The photopolymerizable compositions contain, as is customary in the art, from 0.01 to 10%, particularly from 0.01 to 3%, by weight, based on the composition, of photoinitiators; virtually all compounds which upon exposure to actinic light are capable of forming radicals which initiate polymerization are suitable as photoinitiators. Examples of suitable compounds are acyloins, acyloin ethers, aromatic diketones and derivatives thereof, polynuclear quinones, acridine derivatives and phenazine derivatives. Very suitable are benzoin and α-hydroxymethylbenzoin and their alkyl ethers of 1 to 8 carbon atoms, such as benzoin isopropyl ether, α-hydroxymethylbenzoin methyl ether and benzoin methyl ether, benzil monoketals, such as benzil monodimethyl ketal, benzil monomethyl ethyl ketal, benzil monomethyl benzyl ketal and benzil mononeopentyl ketal.

It is advantageous to add to the photopolymerizable compositions conventional thermal polymerization inhibitors, e.g. hydroquinone, p-methoxyphenol, dinitrobenzene, p-quinone, methylene blue β-naphthol, N-nitrosamines, such as nitrosodiphenylamine, phenothiazine, phosphorous acid esters, such as triphenyl phosphite, and the salts, particularly the alkali metal and aluminum salts, of N-nitrosocyclohexylhydroxylamine, the addition of which has proved to be very advantageous in general and particularly advantageous when polymeric binders having recurring —NH—CO— groups in the main chain of the molecule are employed.

The compositions of the invention may also contain other conventional additives, e.g. plasticizers, saturated low molecular weight compounds having amide groups, and waxes.

Liquid photopolymerizable compositions which have proved highly suitable are mixtures of:

(a) 45 to 75% by weight of an unsaturated polyester having an acid number of 100 to 150, (b) 15 to 25%, particularly 10 to 20%, by weight of a monomer having two carbon-carbon double bonds and containing at least one allyl group, (c) 5 to 25% by weight of a monomer having at least one acrylate or methacrylate group, (d) 1 to 10% by weight of a saturated or unsaturated low molecular weight compound having at least one amide group, (e) 0.2 to 4% by weight of a photoinitiator, (f) 0.003 to 1% by weight of a thermal polymerization inhibitor, and (g) 0.0001 to 1%, particularly 0.0001 to 0.1%, by weight of 9,9'-dianthronyl or 10,10'-bisanthrone.

Processing of the photopolymerizable compositions into photopolymer printing plates having the composition as the relief-forming layer may be effected in the conventional manner and is dependent on the type of mixture and on whether the composition is liquid or solid. Relief plates are produced from the blank material in the conventional manner by imagewise exposure with actinic light from light sources whose emission maxima are in the absorption range of the photoinitiators, generally in the range from 300 to 400 nm, or which emit a sufficient proportion of light of this wavelength range, e.g. low-pressure, medium-pressure and high-pressure mercury vapor lamps, and superactinic fluorescent tubes.

After imagewise exposure, the unexposed areas of the layer are removed mechanically or washed out with developer solution in the conventional manner, and the resulting relief plate is dried. In some cases it may be advantageous to after-expose the entire relief.

The parts and percentages given in the following Examples and Comparative Experiments are by weight, unless stated otherwise. Parts by weight bear the same relation to parts by volume as the kilogram to the liter.

EXAMPLE 1

400 parts of a mixture of equal parts of tetraethylene glycol dimethacrylate and diallyl phthalate, 55 parts of methacrylamide, 2 parts of hydroquinone and 8 parts of benzoin ethyl ether are mixed into 650 parts of an unsaturated polyester prepared from fumaric acid, trimellitic anhydride and diethylene glycol and having an acid number of 140. 15 ppm of bisanthrone (formula III) is mixed into the resulting fluid composition.

Relief printing plates are produced from the resulting composition in the conventional manner:

The liquid composition is cast in a layer on steel sheets, coated with adhesive, serving as supports, and the applied layers are brought to a thickness of 800 $\mu$m with a doctor and then covered with pieces of 9 $\mu$m thick transparent polyester film while avoiding the inclusion of air. The layers of liquid resin are then exposed imagewise through negatives, placed on the polyester films, with a conventional medium-pressure UV lamp. The negatives and polyester films are removed and the unexposed areas of the layers are washed out with a 0.5% strength aqueous sodium bicarbonate solution. The resulting relief plates are dried and after-exposed for 2 minutes.

Evaluation of the relief images obtained shows that the shoulders are non-tacky and sharply defined and that the shadow well depths in a halftone area of 50% tone value ($t_z(50)$) and for a negative dot ($t_z(nP400)$) are advantageous (cf. Table 1).

COMPARATIVE EXPERIMENT 1

The procedure of Example 1 is followed exactly, except that the addition of 15 ppm of bisanthrone is omitted. Evaluation of the relief image shows that the shadow well depths $t_z(50)$ and $t_z(nP400)$ are unsatisfactory and the shoulder shape is unfavorable (cf. Table 1).

Table 1

| Evaluation of the relief images obtained according to Example 1 and Comparative Experiment 1 | | |
|---|---|---|
| | Example 1 | Comparative Experiment 1 |
| Minimum exposure time required to reproduce a 3% highlight dot | 20 seconds | 20 seconds |
| Shadow well depth in a halftone area of 50% tone value $t_z(50)$ | 155$\mu$m | 71$\mu$m |
| Shadow well depth for a negative dot 0.4 mm in diameter $t_z(nP400)$ | 350$\mu$m | 48$\mu$m |
| Shoulders | non-tacky, sharply defined | tacky, poorly defined |

EXAMPLE 2

To a solution of 167 parts of a polystyrene/polybutadiene two-block polymer containing 20% of styrene units, 0.2 part of 2,6-di-tert-butyl-4-methyl phenol, 10 parts of 1,6-hexanediol diacrylate, 20 parts of lauryl acrylate, 2 parts of -methylol benzoin methyl ether and 0.2 part of hydroquinone monomethyl ether in 220 parts by volume of tetrahydrofuran, there is added 75 ppm, based on the solids content, of bisanthrone (formula III) with mixing. The composition thus obtained is applied to a 125 $\mu$m thick polymer sheet, coated with an adhesive, using a doctor and dried. The resulting photopolymer printing plate having a photopolymerizable layer 670 $\mu$m in thickness is exposed imagewise and developed in a spray washout unit with a mixture of trichloroethylene and isopropanol. The results of the evaluation of the relief images are given in Table 2. An advantageous shadow well depth is obtained at the minimum exposure time.

COMPARATIVE EXPERIMENT 2

The procedure of Example 2 is followed exactly, except that the addition of 75 ppm of bisanthrone is omitted. Evaluation of the relief image shows that the shadow well depths $t_z(50)$ and $t_z(nP400)$ are unsatisfactory (cf. Table 2).

Table 2

| Evaluation of the relief images obtained according to Example 2 and Comparative Experiment 2 | | |
|---|---|---|
| | Example 2 | Comparative Experiment 2 |
| Minimum exposure time required | | |

Table 2-continued

Evaluation of the relief images obtained according to Example 2 and Comparative Experiment 2

| | Example 2 | Comparative Experiment 2 |
|---|---|---|
| to reproduce a 3% highlight dot | 12 minutes | 12 minutes |
| Shadow well depth in a halftone area of 50% tone value $t_z(50)$ | 70μm | 45μm |
| Shadow well depth for a negative dot 0.4 mm in diameter $t_z(nP400)$ | 125μm | 65μm |

EXAMPLE 3

196 parts of nonaethylene glycol diacrylate, 64 parts of acrylamide, 185 parts of acetoxyethyl methacrylate, 8 parts of benzoin ethyl ether and 1 part of hydroquinone monomethyl ether are mixed into 710 parts of an unsaturated polyester prepared from fumaric acid, adipic acid, trimellitic anhydride and 1,2-propylene glycol and having an acid number of 105. The resulting fluid mixture has 33 ppm of 9,9'-dianthronyl (formula II) added to it.

Relief plates are produced with the composition thus obtained, as described in Example 1. Evaluation thereof gave the results indicated in Table 3.

COMPARATIVE EXPERIMENT 3

The procedure of Example 3 is followed, but no 9,9'-dianthronyl is added. The results obtained with the relief plates produced with the composition thus obtained are given in Table 3.

Table 3

Evaluation of the relief images obtained according to Example 3 and Comparative Experiment A

| | Example 3 | Comparative Experiment 3 |
|---|---|---|
| Minimum exposure time required to reproduce a 3% highlight dot | 30 seconds | 30 seconds |
| Shadow well depth in a halftone area of 50% tone value $t_z(50)$ | 115μm | 51μm |
| Shadow well depth for a negative dot 0.4 mm in diameter $t_z(nP400)$ | 240μm | 42μm |

EXAMPLE 4

212 parts of bis-(methylolacrylamido)-glycol ether, 85 parts of n-butylbenzene sulfonamide, 1.5 parts of the potassium salt of N-nitrosocyclohexylhydroxylamine and 8 parts of benzoin tetrahydropyranyl ether are mixed into 403 parts of a commercially available alcohol-soluble copolyamide (ULTRAMID 1C - product of BASF Aktiengesellschaft, 6700 Ludwigshafen, Germany) in solution. 70 ppm of 10,10'-bisanthrone (formula III) is added to the resulting mixture.

Polymer layers, on supports, are prepared in a conventional manner from the fluid composition thus obtained which, after their imagewise exposure as described in Example 1 and their development with a mixture of isopropanol and water, give the results indicated in Table 4.

COMPARATIVE EXPERIMENT 4

Plates are prepared as described in Example 4, except that the addition of 10,10'-bisanthrone is omitted. The results obtained with these plates are also given in Table 4.

Table 4

Evaluation of the relief images obtained according to Example 4 and Comparative Experiment 4

| | Example 4 | Comparative Experiment 4 |
|---|---|---|
| Minimum exposure time required to reproduce a 3% highlight dot | 2.2 minutes | 2.0 minutes |
| Shadow well depth in a halftone area of 50% tone value $t_z(50)$ (60 lines/cm screen) | 28μm | 14μm |
| Shadow well depth for a negative dot 0.4 mm in diameter $t_z(nP400)$ | 110μm | 25μm |

We claim:

1. A photopolymerizable composition for the production of printing plates and relief plates, consisting essentially of a photoinitiator-containing mixture of at least one low molecular weight compound having at least one olefinically unsaturated photopolymerizable double bond with at least one organic polymeric binder that is compatible with said compound, wherein the composition contains, uniformly dispersed therein, from about 0.0001 to 1% by weight of 9,9'-dianthronyl or 10,10'-bisanthrone.

2. A photopolymerizable composition as claimed in claim 1, wherein the amount of anthrone compound is from 0.0001 to 0.1% by weight.

3. A photopolymerizable composition as claimed in claim 1, including a thermal polymerization inhibitor.

4. A photopolymerizable composition as claimed in claim 1, wherein said organic polymeric binder has recurring —NH—CO— groups in the main chain of the molecule.

5. A photopolymerizable composition as claimed in claim 4, including a thermal polymerization inhibitor.

* * * * *